(12) United States Patent
Ho et al.

(10) Patent No.: US 7,332,919 B1
(45) Date of Patent: Feb. 19, 2008

(54) METHOD AND APPARATUS FOR DISTRIBUTING SIGNALS OVER JIG-PLATES

(75) Inventors: Ronald Ho, Mountain View, CA (US); Robert J. Drost, Mountain View, CA (US); Arthur R. Zingher, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 85 days.

(21) Appl. No.: 11/232,843

(22) Filed: Sep. 21, 2005

Related U.S. Application Data

(60) Provisional application No. 60/618,645, filed on Oct. 13, 2004.

(51) Int. Cl.
*G01R 31/02* (2006.01)
(52) U.S. Cl. .................................. 324/754
(58) Field of Classification Search .............. None
See application file for complete search history.

(56) References Cited

U.S. PATENT DOCUMENTS 3,073,588 A * 1/1963 Morton .................. 269/40
6,373,258 B2 * 4/2002 Takada .................. 324/537
6,958,538 B1 * 10/2005 Lauterbach et al. ........ 257/723
7,170,121 B1 * 1/2007 Lauterbach et al. ........ 257/288

FOREIGN PATENT DOCUMENTS

JP         05119098 A    *  5/1993

* cited by examiner

*Primary Examiner*—Jermele Hollington
(74) *Attorney, Agent, or Firm*—Park, Vaughan & Fleming LLP; Anthony P. Jones

(57) ABSTRACT

One embodiment of the present invention provides a system for distributing signals through a jig-plate in a computer system. The jig-plate contains alignment features that assist in positioning semiconductor chips in relation to the jig-plate. In addition, the jig-plate contains one or more embedded signal routing layers. These metal routing layers provide one or more signal routes for the distribution of signals through the jig-plate to semiconductor chips which have been aligned with the jig-plate. Note that routing the signals through the jig-plate facilitates the distribution of the signals without requiring that the signals be routed through the semiconductor chips in the jig-plate.

18 Claims, 4 Drawing Sheets

METHOD AND APPARATUS FOR DISTRIBUTING SIGNALS OVER JIG-PLATES

RELATED APPLICATION

This application hereby claims priority under 35 U.S.C. § 119 to U.S. Provisional Patent Application No. 60/618,645 filed on 13 Oct. 2004, entitled "Signal Distribution Over Jig Plates," by inventors Ronald Ho, Robert J. Drost, and Arthur R. Zingher.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to techniques for improving the performance of computer systems. More specifically, the present invention relates to a method and an apparatus for distributing signals through jig-plates which hold chips in place in a computer system.

2. Related Art

Many systems require semiconductor chips to be assembled into a computer system with very precise alignment. For instance, systems in which chips communicate via capacitive coupling require chips to be precisely aligned to facilitate the capacitive communication between the chips.

The need for precise alignment is not limited to systems that use capacitive coupling. For example, chips communicating through traditional conductive connections may also require careful alignment. Furthermore, imaging applications where multiple tiled chips comprise a single display may require very accurate chip placement.

Designers can use an alignment plate, or a "jig-plate," to achieve this precise chip-to-chip alignment. A number of alignment features can be used to achieve this alignment, such as registration posts, grooves, edges or cutouts. In one example, a jig-plate may include cut-out openings which are configured to receive semiconductor chips. These cut-outs are formed with sufficient accuracy to ensure that the chips align properly. In many applications, the alignment tolerances are within fractions of a micron.

For example, FIG. 1 illustrates a jig-plate with nine cutouts. Note that the chips which are inserted into these cutouts are precisely aligned with respect to the other chips in the jig-plate. This type of jig-plate can be used in applications such as an imaging chip array.

FIG. 2 illustrates another type of jig-plate which has four deep cutouts (marked with hashes) and four shallow cutouts (marked in white). In this jig-plate, four chips can be placed face-up in the deep cutouts and another four chips can be placed face-down in the shallow cutouts, thereby facilitating corner-wise capacitively coupled communication between the chips.

In addition to the alignment requirements, systems typically require a small number of signals to be distributed across all chips in the system. For example, a global clock signal is typically distributed from a common source to each component in a synchronous system. In asynchronous systems, a secondary clock signal, which is used solely for testing, telemetry, and debugging, can be distributed from a common source to each component that requires it. In addition, some in-order processor architectures make use of a "stall" signal which is transmitted from a single control source to every computational unit.

Distributing such signals across existing chip-to-chip interfaces creates significant complications. Chips run at different speeds, so signals traversing different chips encounter different delays, which can cause sizable system-wide skew. In addition, different chips are subject to different time-varying power-supply voltages, signal activity levels, temperature, and noise, which can cause considerable jitter in the broadcast signals. Moreover, providing pathways for these signals through chip-to-chip interfaces consumes metallization and transistor resources on the chips themselves.

Hence, what is needed is a method and an apparatus for distributing signals in a system without the above-described performance problems.

SUMMARY

One embodiment of the present invention provides a system for distributing signals through a jig-plate in a computer system. The jig-plate contains alignment features that assist in positioning semiconductor chips in relation to the jig-plate. In addition, the jig-plate contains one or more embedded signal routing layers. These metal routing layers provide one or more signal routes for the distribution of signals through the jig-plate to semiconductor chips which have been aligned with the jig-plate. Note that routing the signals through the jig-plate facilitates the distribution of the signals without requiring that the signals be routed through the semiconductor chips in the jig-plate.

In a variation of this embodiment, the jig-plate is configured so that signals can be coupled to the jig-plate either from an external source or from a semiconductor chip that has been aligned with the jig-plate.

In a variation of this embodiment, the jig-plate is configured so that signals can be coupled either from the jig-plate to an external receiver or to a receiver on a semiconductor chip that has been aligned with the jig-plate.

In a variation of this embodiment, the jig-plate is configured so that signals are routed as an H-tree; a grid; a spine; or a distribution system that facilitates the communication of signals between a single source and multiple destinations.

In a variation of this embodiment, the jig-plate is configured so that a signal connection between a signal source and the jig-plate or between the jig-plate and a semiconductor chip that has been aligned with the jig-plate is conductive.

In a variation of this embodiment, the jig-plate is configured so that a signal connection between a signal source and the jig-plate or between the jig-plate and a semiconductor chip that has been aligned with the jig-plate is capacitive.

In a variation of this embodiment, the jig-plate is configured so that a signal connection between a signal source and the jig-plate or between the jig-plate and a semiconductor chip that has been aligned with the jig-plate is inductive.

In a variation of this embodiment, transistors are fabricated into the jig-plate. In one embodiment of the present invention, these transistors are used to amplify and control the signals that are distributed though the jig-plate.

In a variation of this embodiment, the jig-plate is configured so that the alignment features include cut-outs that are at multiple depths, thereby facilitating three-dimensional stacking of chips within the jig-plate.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Jig-Plate with Routing Layer

Figure 1:
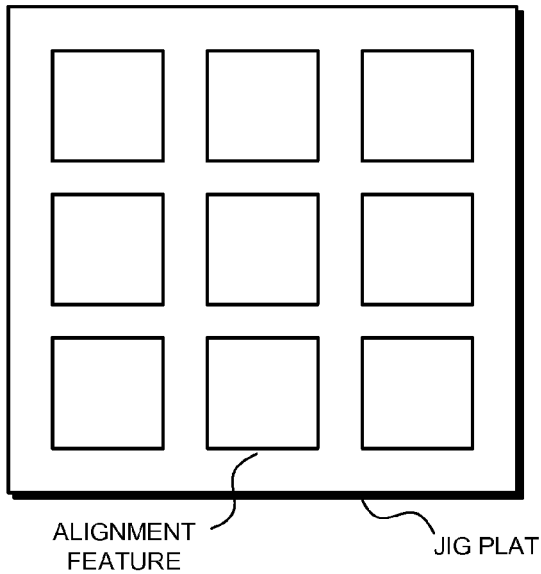
FIG. 1 illustrates a jig-plate with nine cut-outs in accordance with an embodiment of the present invention.
Figure 2:
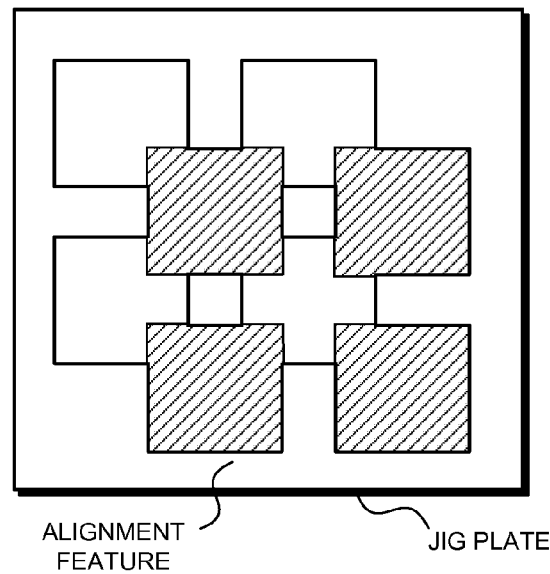
FIG. 2 illustrates a jig-plate with four deep cut-outs and four shallow cut-outs in accordance with an embodiment of the present invention.
Figure 3:
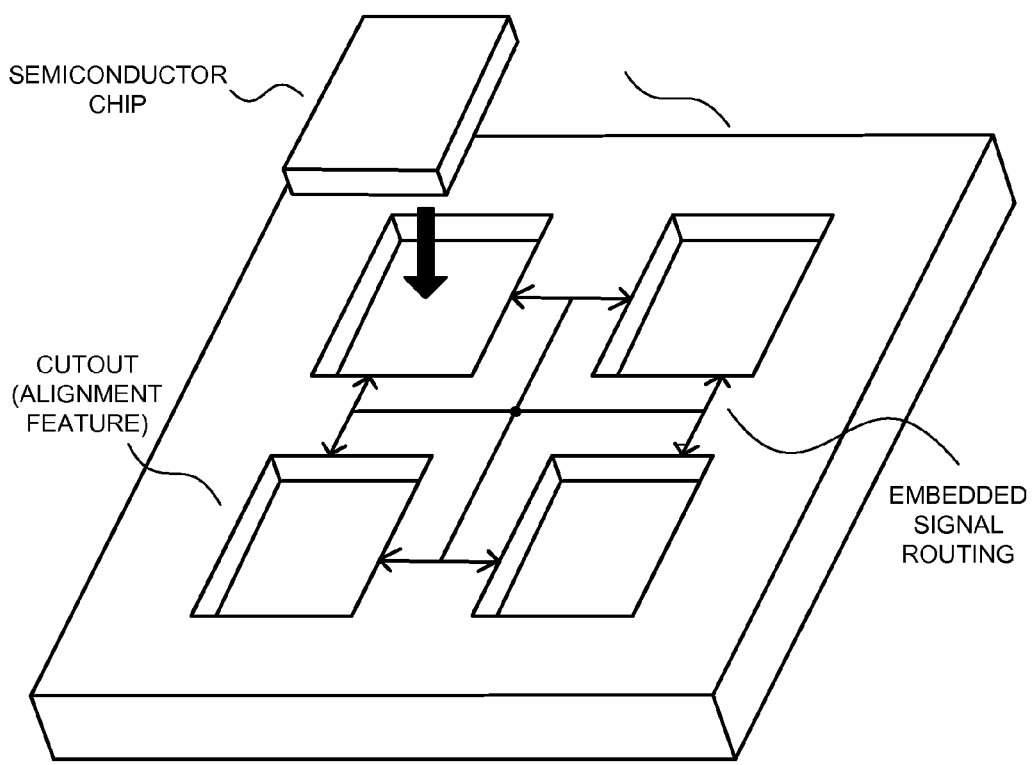
FIG. 3 illustrates the routing of a signal on a jig-plate with four cut-outs in accordance with an embodiment of the present invention.

FIG. 3 illustrates the routing of a signal on a jig-plate with four cut-outs in accordance with an embodiment of the present invention. This jig-plate can be constructed from many different insulating materials. In one embodiment of the present invention, a silicon substrate is used to construct the jig-plate. Note that using silicon as the jig-plate substrate eases the costs of fabrication, because the jig-plates can be fabricated with existing silicon or micro-electro-mechanical systems (MEMS) foundries.

During fabrication, one or more layers of embedded metal routing are added to the silicon jig-plate. The routes in the metal routing layer are used to distribute signals through the jig-plate to the semiconductor chips held within the cut-outs in the jig-plate. By using routes within the embedded metal routing layer, designers to avoid routing the signals through the individual chips in the jig-plate, thereby avoiding the associated complications.

Note that using the embedded metal routing in the jig-plate allows the designer to avoid many of the problems associated with routing signals in an integrated circuit. Individual metal wires routed within the jig-plate can be fabricated at a width much wider than the minimum width, with robust AC-ground return paths placed nearby, thereby preventing damaging interference between the lines. The metal wires can also be twisted or be inter-digitated with ground lines, reducing skin effects. Wires fabricated in this fashion approximate micro-strip transmission lines, with low dispersion and functional operation in a domain limited by inductance and capacitance rather than by resistance and capacitance. Furthermore, such wires have little joule-heating and consume energy primarily where driven.

Figure 4A:
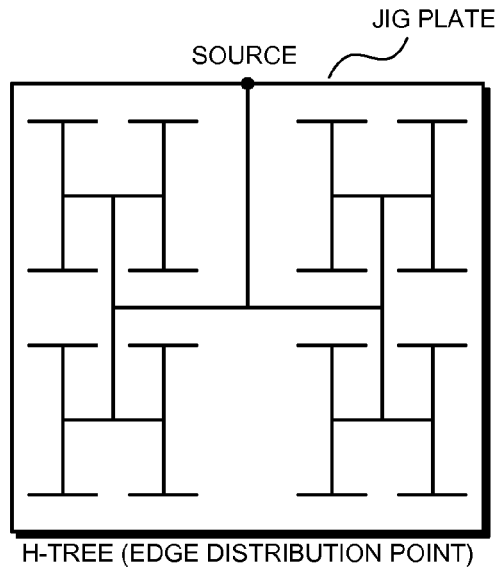
FIG. 4A illustrates an H-tree distribution system for distributing a signal through a jig-plate in accordance with an embodiment of the present invention.

The source of the signals distributed through the jig-plate can be one of the chips in the jig-plate or can be an external source (FIG. 4A illustrates an external source). In both cases, the source can couple into the jig-plate through either a conductive or a non-conductive connection.

With a conductive connection, either press-fit or soldered connectors allow the signal to enter the distribution grid with relatively low loss. The conductive connection can be used where long-term reliability is an important consideration. On the other hand, with a non-conductive connection the source couples to the jig-plate distribution grid via capacitively coupled or inductively coupled communication. The non-conductive connection can be used where re-workability is an important consideration.

Note that signal transmission using capacitively coupled or inductively coupled communication leads to a reduction in signal amplitude (or signal energy) as the signal is transmitted from the source to the distribution grid, thereby requiring the jig-plate to distribute a low-amplitude signal. The lower amplitude signal leads to increased noise concerns and electrical amplification delays.

Chips inserted into the cut-outs in the jig-plate can also receive the signals via either a conductive or non-conductive connection. As with the signal sources, the conductive connection minimizes signal loss but limits re-workability (soldered) or long-term reliability (press-fit), but non-conductive connections (capacitively coupled or inductively coupled communication) lead to lower signal amplitudes within the distribution grid.

Being one consistent piece, the jig-plate does not suffer from dramatic differences in physical parameters from point to point within the jig-plate, nor does the jig-plate suffer large power supply inconsistencies. The jig-plate can possibly have some cross-wafer "tilt," or parameter variation, but because the wires on the jig-plate are much larger than minimum size, this variation has only minor effects on signal transmission.

In one embodiment of the present invention, the jig-plate is "active." In this scheme, the jig-plate contains transistors which require power and which dissipate heat but also do useful work. For example, these transistors can be used to amplify small signals coupled into the jig-plate through non-conductive connectors (such as those using capacitively coupled communication). These transistors can also repeat the signals routed through the jig-plate, thereby minimizing delay through the distribution grid. To a first order, delay through the distribution grid is not an important consideration, because the delay does not affect skew. However, increased delay eventually leads to increased jitter, so minimizing delay is beneficial. In addition, the jig-plate transistors can be used in a closed-loop control scheme in which transistor-based sensors detect and correct delay variations across different parts of the distribution grid.

Jig-Plate Routing Distribution Schemes

Figure 4B:
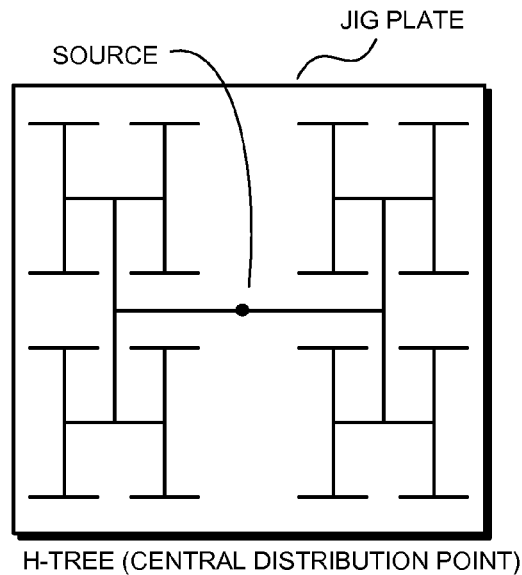
FIG. 4B illustrates an H-tree distribution system for distributing a signal through a jig-plate in accordance with an embodiment of the present invention.
Figure 5:
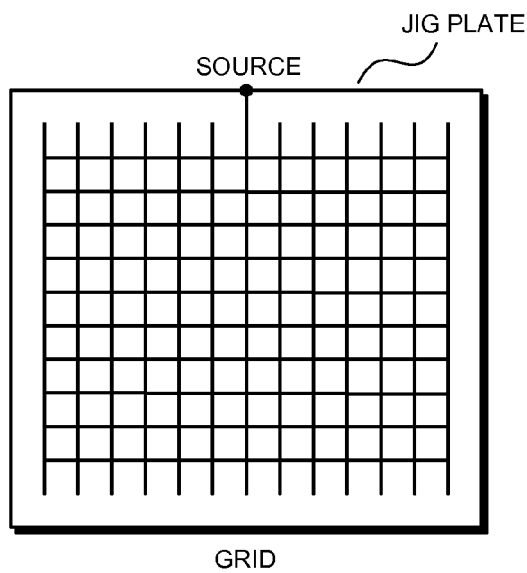
FIG. 5 illustrates a grid distribution system for distributing a signal through a jig-plate in accordance with an embodiment of the present invention.
Figure 6:
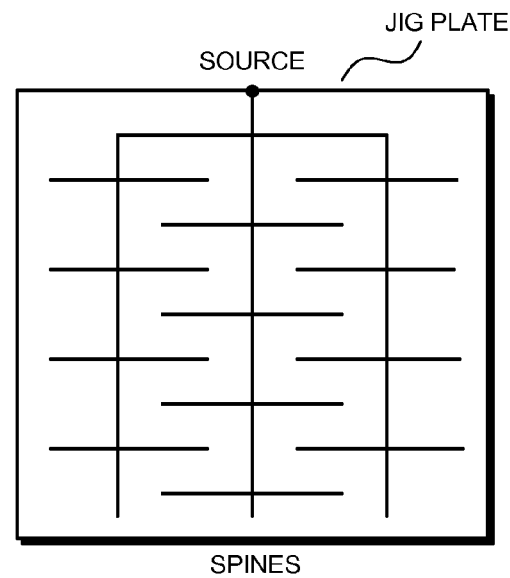
FIG. 6 illustrates a spinal distribution system for distributing a signal through a jig-plate in accordance with an embodiment of the present invention.

FIGS. 4A-4B illustrate an H-tree distribution system for distributing a signal through a jig-plate, FIG. 5 illustrates a grid distribution system for distributing a signal through a jig-plate, and FIG. 6 illustrates a spinal distribution system for distributing a signal through a jig-plate, in accordance with embodiments of the present invention.

As shown in FIGS. 4A-6, the metal routes within the jig-plate can be patterned into a distribution grid. Such a grid may be an H-tree (FIGS. 4A-4B), in which every leaf of the distribution grid has the same path length to the origin. The grid may also be a true mesh (FIG. 5), in which each spur, or leg, of the mesh is connected to the others. Otherwise, the grid may be a spine (FIG. 6), in which various leaves are grouped together and each group fed with its own spine.

The H-tree grid can be fed from the edge of the chip, as shown in FIG. 4A, or can be fed from an arbitrary spot on the chip, as shown in FIG. 4B. Note that this principle extends to the other distribution grids that can be used with the jig-plate.

Embedded Signal Routing Layer

Figure 7:
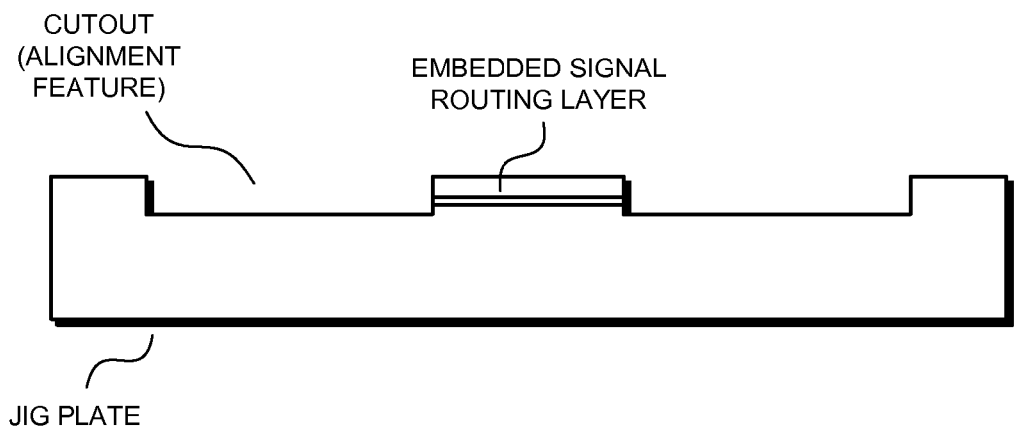
FIG. 7 presents a cut-away illustration of a jig plate with an embedded signal routing layer in accordance with embodiments of the present invention.

FIG. 7 presents a cut-away illustration of a jig plate with an embedded signal routing layer in accordance with embodiments of the present invention. In some embodiments of the present invention, the jig plate is fabricated of an insulating material, such as silicon, and the embedded signal routing layer is a conductive material, such as metal. The embedded signal routing layer is used to transfer signals between semiconductor chips that are placed in the cutouts in the jig plate. The embedded signal routing layer can also be coupled to an external source or receiver to transfer signals between the external source or receiver and the semiconductor chips that are placed in the cutouts in the jig plate.

Signal Routing Using a Jig Plate

Figure 8:
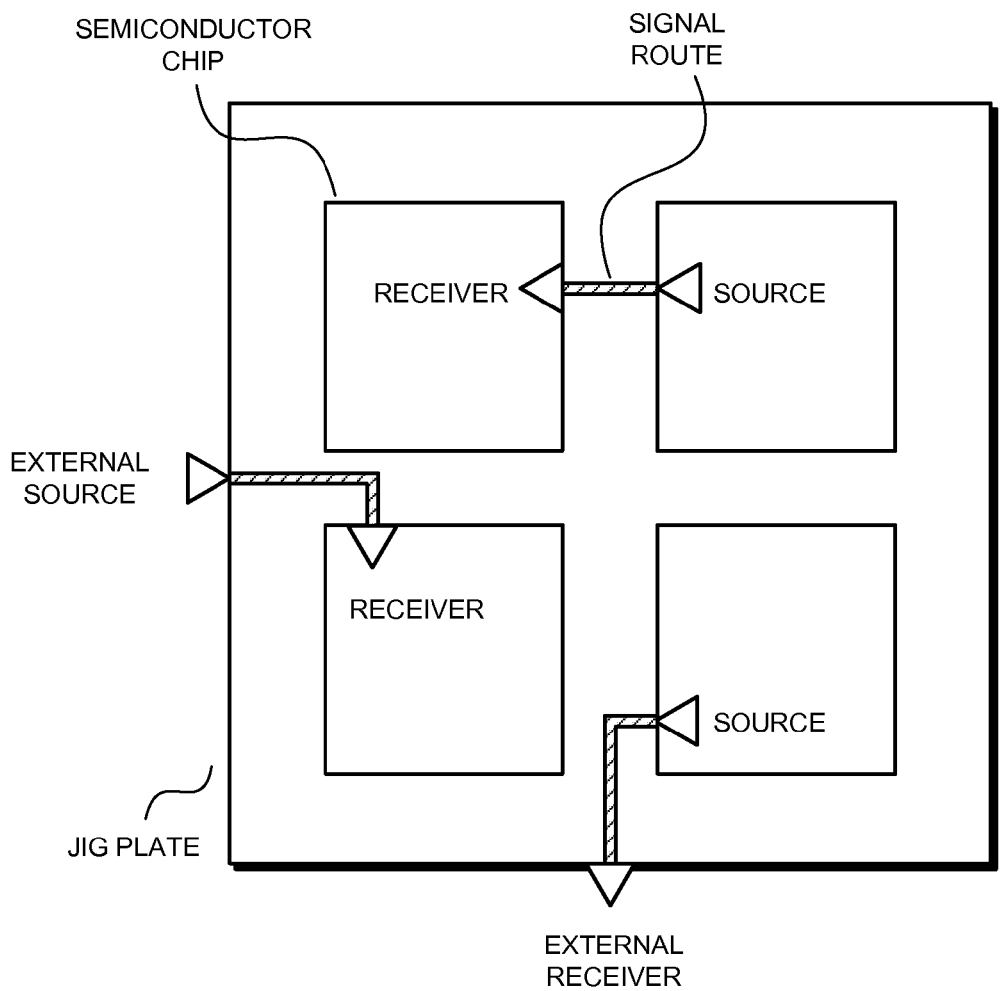
FIG. 8 presents a jig plate that includes embedded signal routes in accordance with embodiments of the present invention.

FIG. 8 presents a jig plate that includes embedded signal routes in accordance with embodiments of the present invention. In FIG. 8, there are three signal routes: a signal route between two semiconductor chips placed in the jig plate; a signal route between a source on a semiconductor chip and an external receiver; and a signal route between an external source and a receiver on a semiconductor chip.

Computer System

Figure 9:
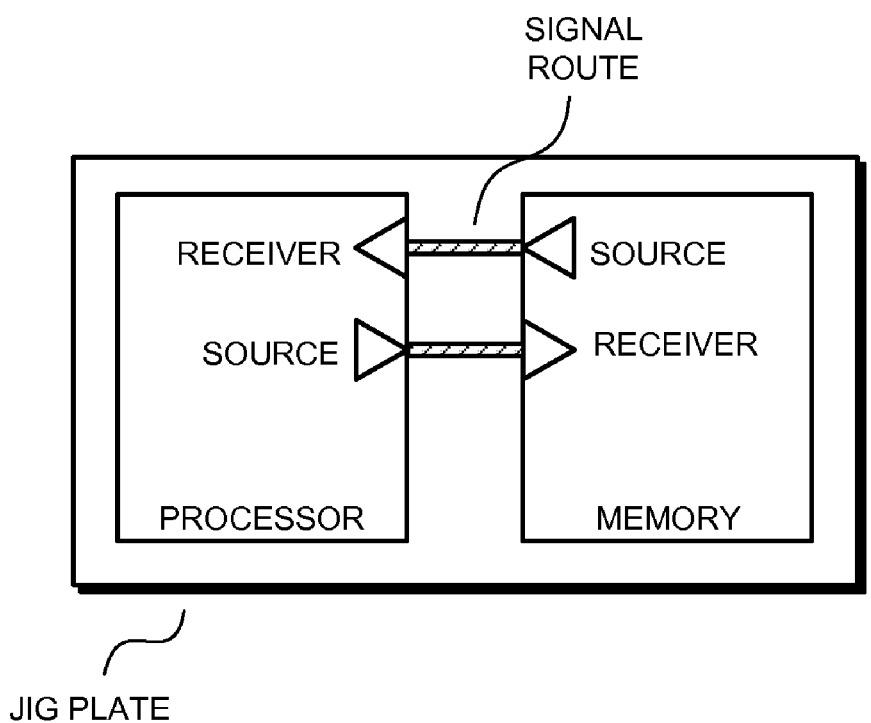
FIG. 9 presents a computer system that uses a jig plate in accordance with embodiments of the present invention.

FIG. 9 presents a computer system that uses a jig plate in accordance with embodiments of the present invention. In FIG. 9, the semiconductor chips placed in the cutouts in the jig plate are a processor and a memory. The jig plate includes two exemplary signal routes between the processor and the memory. The exemplary signal routes couple a source on the processor to a receiver on the memory and vice versa. In some embodiments of the present invention, the processor and the memory use these signal routes to transfer data and instructions. Note that the computer system may include one or more additional semiconductor chips and signal routes between the additional semiconductor chips, the processor, the memory, and/or external sources or receivers.

Active Jig Plate

Figure 10:
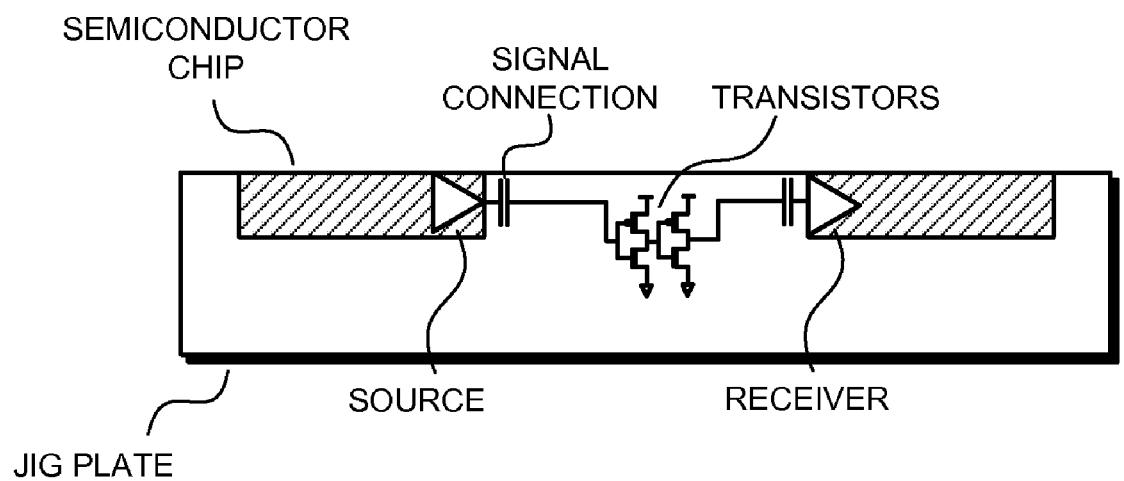
FIG. 10 presents an active jig plate in accordance with embodiments of the present invention.

FIG. 10 presents an active jig plate in accordance with embodiments of the present invention. An active jig plate includes transistors that can be used to do useful work. For example, as shown in FIG. 10, the transistors can be part of a repeater that is used to amplify the small signals coupled to the jig plate through the non-conductive signal connections.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for distributing signals within a computer system, comprising:
   a jig-plate;
   wherein the jig-plate contains alignment features that assist in positioning semiconductor chips in relation to the jig-plate; and
   wherein the jig-plate contains at least one embedded signal routing layer, wherein each signal routing layer is configured to provide one or more signal routes for distributing signals through the jig-plate to the semiconductor chips that have been aligned with the jig-plate;
   wherein routing the signals through the jig-plate facilitates distribution of the signals without requiring the signals to be distributed through the semiconductor chips in the jig-plate.

2. The apparatus of claim 1, wherein the jig-plate is configured so that signals can be coupled to the jig-plate from:
   an external source; or
   a source on a semiconductor chip that has been aligned with the jig-plate.

3. The apparatus of claim 1, wherein the jig-plate is configured so that signals can be coupled from the jig-plate to:
   an external receiver; or
   a receiver on a semiconductor chip that has been aligned with the jig-plate.

4. The apparatus of claim 1, wherein each signal route within jig-plate is configured as:
   an H-tree;
   a grid;
   a spine; or
   a distribution system that facilitates the communication of signals between a single source and multiple destinations.

5. The apparatus of claim 1, wherein the jig-plate is configured so that a signal connection between a signal source and the jig-plate or between the jig-plate and a semiconductor chip that has been aligned with the jig-plate is conductive.

6. The apparatus of claim 1, wherein the jig-plate is configured so that a signal connection between a signal source and the jig-plate or between the jig-plate and a semiconductor chip that has been aligned with the jig-plate is capacitive.

7. The apparatus of claim 1, wherein the jig-plate is configured so that a signal connection between a signal source and the jig-plate or between the jig-plate and a semiconductor chip that has been aligned with the jig-plate is inductive.

8. The apparatus of claim 1, further comprising transistors fabricated into the jig-plate,
   wherein the transistors are configured to amplify and control the signals that are distributed though the jig-plate.

9. The apparatus of claim 1, wherein the alignment structures include cut-outs are at multiple depths, thereby facilitating the three-dimensional stacking of chips within the jig-plate.

10. A computer system, comprising:
- a processor;
- a memory;
- a jig-plate;
- wherein the jig-plate contains alignment features that assist in positioning semiconductor chips in relation to the jig-plate; and
- wherein the jig-plate contains at least one embedded signal routing layer, wherein each signal routing layer is configured to provide one or more signal routes for distributing signals to the semiconductor chips that have been aligned with the jig-plate;
- wherein routing the signals through the jig-plate facilitates distribution of the signals without requiring the signals to be distributed through the semiconductor chips in the jig-plate.

11. The computer system of claim 10, wherein the jig-plate is configured so that signals can be coupled to the jig-plate from:
- an external source; or
- a source on a semiconductor chip that has been aligned with the jig-plate.

12. The computer system of claim 10, wherein the jig-plate is configured so that signals can be coupled from the jig-plate to:
- an external receiver; or
- a receiver on a semiconductor chip that has been aligned with the jig-plate.

13. The computer system of claim 10, wherein each signal route within the jig-plate is configured as:
- an H-tree;
- a grid;
- a spine; or
- a distribution system that facilitates the communication of signals between a single source and multiple destinations.

14. The computer system of claim 10, wherein the jig-plate is configured so that a signal connection between a signal source and the jig-plate or between the jig-plate and a semiconductor chip that has been aligned with the jig-plate is conductive.

15. The computer system of claim 10, wherein the jig-plate is configured so that a signal connection between a signal source and the jig-plate or between the jig-plate and a semiconductor chip that has been aligned with the jig-plate is capacitive.

16. The apparatus of claim 10, wherein the jig-plate is configured so that a signal connection between a signal source and the jig-plate or between the jig-plate and a semiconductor chip that has been aligned with the jig-plate is inductive.

17. The computer system of claim 10, further comprising transistors fabricated into the jig-plate,
- wherein the transistors are configured to amplify and control the signals that are distributed though the jig-plate.

18. The computer system of claim 10, wherein the alignment features include cut-outs are at multiple depths, thereby facilitating the three-dimensional stacking of chips within the jig-plate.

* * * * *